US005380955A

United States Patent [19]

Argyrakis et al.

[11] Patent Number: 5,380,955

[45] Date of Patent: Jan. 10, 1995

[54] DEVICE FOR PASSING A MEMBER THROUGH A SEALED CHAMBER WALL

[75] Inventors: Straty N. Argyrakis, Highland; Willard S. Harris, Red Hook; Richard W. Oldrey, Clintondale; Edward J. Ossolinski, Poughkeepsie, all of N.Y.

[73] Assignee: International Business Machines Corporation, Armonk, N.Y.

[21] Appl. No.: 987,932

[22] Filed: Dec. 8, 1992

[51] Int. Cl.[6] .......... H01B 17/26

[52] U.S. Cl. .......... 174/151

[58] Field of Search .......... 174/151, 152 R, 153 R; 439/571-573, 579, 594

[56] References Cited

U.S. PATENT DOCUMENTS

| | | | |
|---|---|---|---|
| 2,976,195 | 3/1961 | Angeloff | 174/18 X |
| 3,101,387 | 8/1963 | Mihran | 174/18 |
| 3,142,500 | 7/1964 | Wesseler | 174/77 RX |
| 3,767,835 | 10/1973 | Engelhardt | 174/19 X |
| 3,825,320 | 7/1974 | Redfern | 174/152 R |
| 4,037,046 | 7/1977 | Hoeg | 174/18 |
| 4,168,394 | 9/1979 | Yuey | 174/151 |
| 4,737,601 | 4/1988 | Gartzue | 174/152 GM |
| 5,110,307 | 5/1992 | Rapoza | 174/152 GM X |
| 5,194,697 | 3/1993 | Hegner et al. | 174/151 |

OTHER PUBLICATIONS

Straty Argyrakis, "High Frequency/High Density/High Vacuum Transmission Line Interface" Connection Technology, Feb. 1991.

Straty Argyrakis, "High-Vacuum/High-Frequency/High-Density Flex Cable" IBM Technical Disclosure Bulletin, vol. 34, No. 2, Jul. 1991, pp. 158-160.

Charles E.T. White & Gregory P. Evans, "Choose The Right Alloy for Each Soldering Job" Research & Development, Indium Corporation of America.

*Primary Examiner*—Leo P. Picard
*Assistant Examiner*—Christopher Horgan
*Attorney, Agent, or Firm*—Harold Huberfeld

[57] ABSTRACT

A device is provided for passing a member through the wall of a sealed chamber. The member has an outer surface having a portion thereof which is substantially formed of metal. A flange has an opening therein which surrounds and is spaced from the metal portion of the member. A solder member completely fills the space between the flange opening and the metal portion of the member for creating a seal therebetween which is capable of maintaining a high pressure differential between opposite sides of the sealed chamber wall. The member is preferably a flat, multi-conductor electrical cable having thin, flat, copper shielding layers on the top and bottom thereof. The metal portion preferably includes a wedge-shaped copper member which surrounds the electrical cable and is intricately affixed to the shielding layers. The solder member is preferably a solder compound comprising 52 percent indium and 48 percent tin.

9 Claims, 3 Drawing Sheets

52 50 54 30

DEVICE FOR PASSING A MEMBER THROUGH A SEALED CHAMBER WALL

The present invention relates generally to a device for passing a member through the wall of a sealed chamber and a method of manufacturing such a device and more particularly to a flange adapted to be mounted on the wall of a high vacuum chamber for passing flat multi-conductor electrical cables therethrough in a sealed fashion and a method of manufacturing such a flange.

BACKGROUND OF THE INVENTION

In the process of testing microelectronic devices and circuits, particularly integrated circuits, such devices and circuits are routinely placed in very high vacuum environments on the order of $1\times10^{-7}$ Torr. It is further frequently desirable to place certain components, such as multi-chip modules in a high vacuum operating environment. Such an environment is typically achieved in a high vacuum chamber. It is often necessary to communicate high frequency, high density electrical signals along a tuned impedance transmission line to such devices and circuits under test from test equipment or from other sections of an apparatus located outside the chamber. In the publication "High Frequency/High Density/High Vacuum Transmission Line Interface" by S. N. Argyrakis, one of the inventors in the present application, published Feb. 19, 1991, in CONNECTION TECHNOLOGY, the above problem is discussed in detail. As disclosed therein, when such cables are passed through the chamber wall, a potting epoxy compound is typically utilized in the feed-through area to seal the cable to the chamber wall thereby maintaining the integrity of the vacuum within the chamber. Such epoxy potting compounds typically contain entrapped gas molecules which are drawn out of the epoxy by the vacuum environment through a process called outgassing. Such outgassing has a negative impact on the productivity of the testing operation. Applicants have recognized a need for an improved technique for passing such cables through the wall of a vacuum chamber.

SUMMARY OF THE INVENTION

A feature of the present invention is the provision of a device for passing a member through the wall of a sealed vacuum chamber which will overcome the aforementioned outgassing problem.

Another feature of the present invention is the provision of a device which is particularly suitable for passing a flat multi-conductor cable through the wall of a sealed vacuum chamber.

A further feature of the present invention is the provision of a device for passing a member through the wall of a sealed vacuum chamber which is both relatively simple and inexpensive to manufacture.

Thus, in accord with the present invention, a device is provided for passing a member through the wall of a sealed chamber. The member has an outer surface having a portion thereof which is substantially formed of metal. A flange has an opening therein which surrounds and is spaced from the metal portion of the member. A solder member completely fills the space between the flange opening and the metal portion of the member for creating a seal therebetween which is capable of maintaining a high pressure differential between opposite sides of the sealed chamber wall.

In a preferred embodiment, the metal is copper and the member is a flat, multi-conductor electrical cable having thin, flat, copper shielding layers on the top and bottom thereof. A wedge-shaped copper member surrounds the electrical cable and is integrally affixed to the shielding layers. The solder member is preferably a solder compound comprising 52 percent indium and 48 percent tin.

In accordance with the method of the present invention, such a device may be manufactured by surrounding a portion of a narrow surface of the member with a copper collar and integrally bonding the copper collar to the outer surface of the member. An outer surface of the copper collar is then coated with a solder compound. The copper collar is then surrounded by a flange, and the flange and copper collar are heated to a temperature above the melting point of the solder compound thereby causing the solder compound to reflow, in turn, bonding and sealing the copper collar and the flange.

Other features and advantages of the present invention will become apparent from the following detailed description of the invention when considered in conjunction with the accompanying drawings.

DESCRIPTION OF THE PREFERRED EMBODIMENTS

Figure 7:
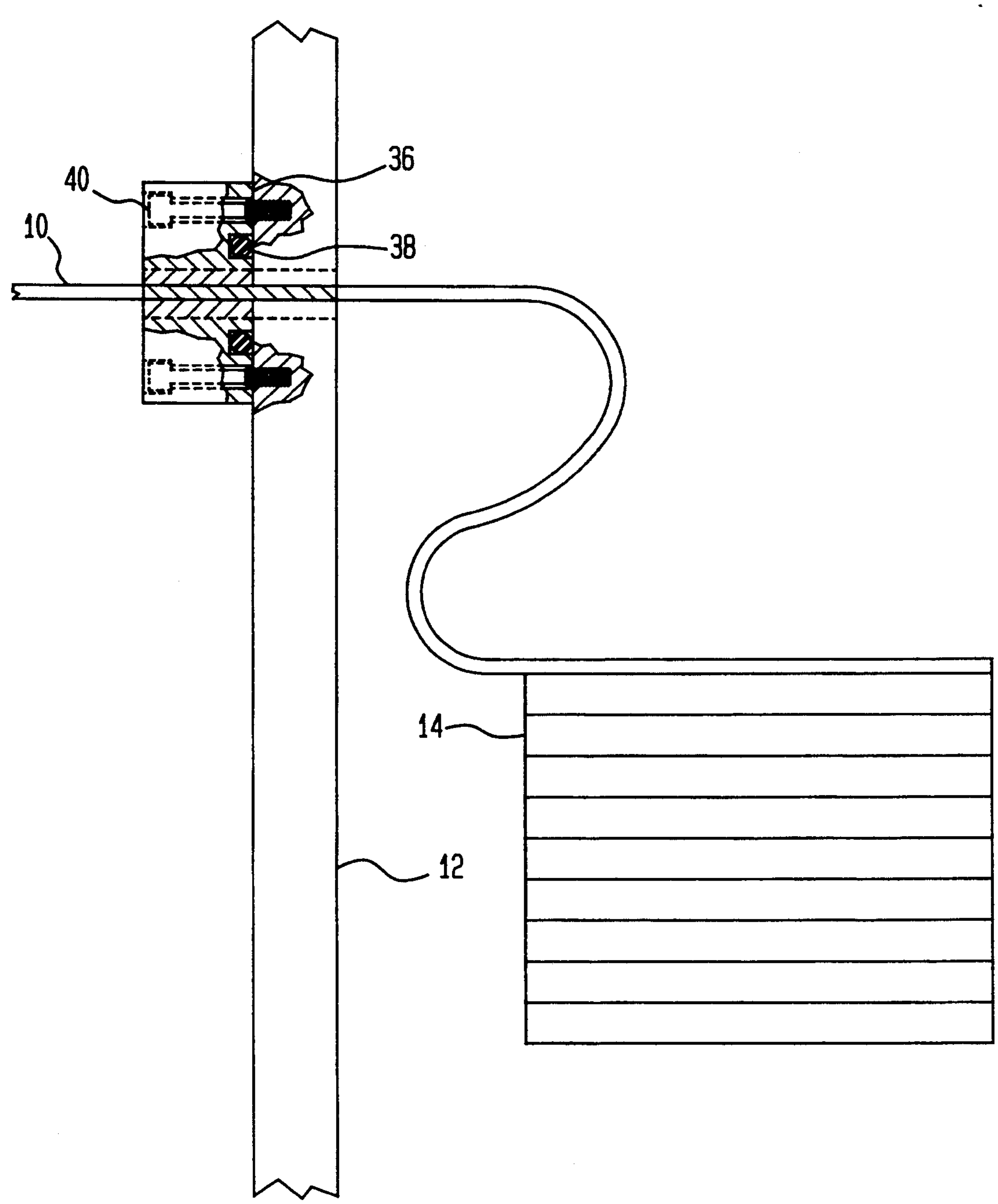
FIG. 7 shows the device of FIG. 1 as mounted on a chamber wall and connected to a test site.

In a generalized schematic form the device of the present invention will first be described in connection with FIGS. 1 and 7. A member 10 preferably in the form of a flat, flexible, multi-conductor electrical cable is required to be passed through the wall 12 of a sealed chamber and connected to a test site 14. Although the present invention particularly relates to the inter-connection of test equipment by means of such cables 10 to test sites in a high-vacuum chamber environment, the present invention has equal applicability to the interconnection of test equipment with test sites in other sealed chamber environments, such as temperature controlled environments, and also applies to the use of fluid conduits and electrical conduits to deliver test signals information, etc., through a sealed chamber wall. Furthermore the present invention also relates to the interconnection of components in an operating environment wherein at least one component is housed in a vacuum chamber.

Figure 1:
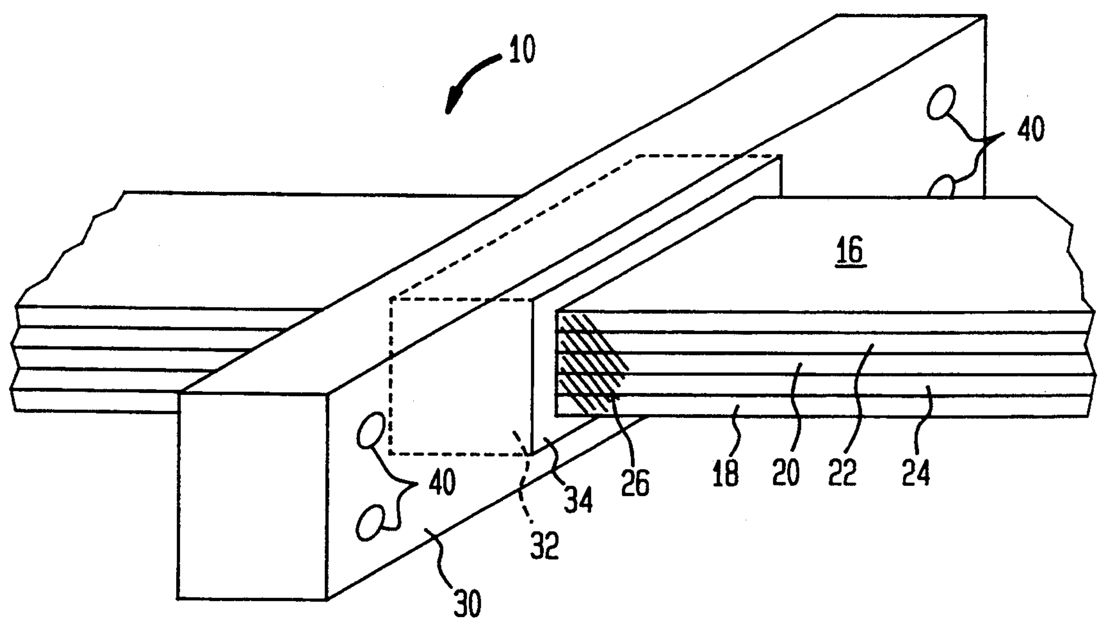
FIG. 1 shows a pictorial view of a first embodiment of the device of the present invention in schematic form.
Figure 3:
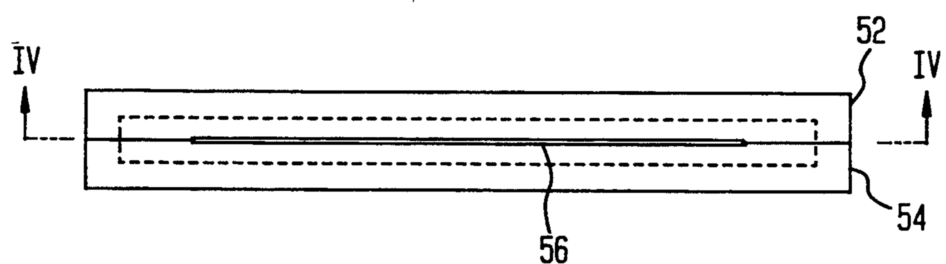
FIG. 3 shows a front view of a wedge-shaped collar forming part of the device shown in FIGS. 2A and 2B.
Figure 4:
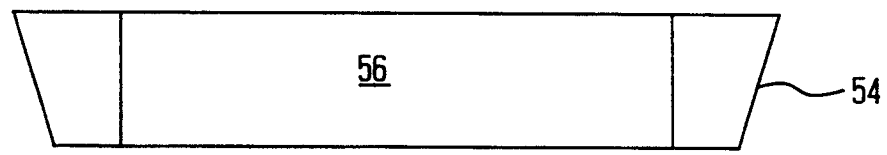
FIG. 4 shows a sectional view taken along line IV—IV of FIG. 3.
Figure 5:
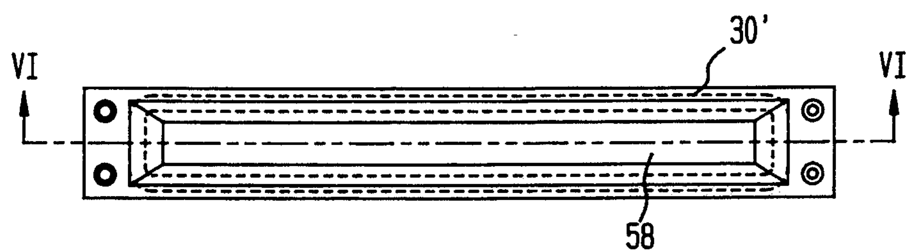
FIG. 5 shows a front view of a flange forming part of the device shown in FIGS. 2A and 2B.
Figure 6:
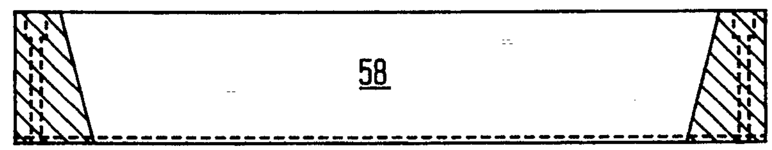
FIG. 6 shows a sectional view taken along line VI—VI of FIG. 5.

As shown in FIG. 1, the thickness of cable 10 is greatly exaggerated for clarity of explanation. Cables of the type generally illustrated in FIG. 1 are shown in U.S. Pat. No. 4,441,088 to Anderson and assigned to the assignee of the present invention and the aforementioned CONNECTION TECHNOLOGY publication. Such cables typically have outer surfaces which are substantially copper as a result of having a thin, flat copper shielding layer 16 on one side of the cable and an identical copper shielding layer 18 on the opposite side of the cable. Such cables further typically include a plurality of copper signal carrying conductors 20 separated from each other and from the copper shielding layers 16 and 18 by a suitable dielectric such as polyimide layers 22 and 24. In accord with the present invention, at least a portion 26 of the cable sidewall is plated with copper. A flange 30 has an opening 32 therein adapted to have the cable 10 pass therethrough. Thus, the flange 30 surrounds and is spaced from the conductors 16 and 18 and the copper plating portion 26 of cable 10. A metal solder member 34 completely fills the space between the flange opening and the conductors 16 and 18 and the plated portion 32. The metal solder member 34 is preferably a solder compound composed of 52 percent indium and 48 percent tin and creates a seal between the cable 10 and the flange 30 capable of maintaining a high pressure differential between opposite sides of the sealed chamber wall 12. The flange 30 includes a surface 36 adapted to engage the sealed chamber wall 12. Recessed and retained within the surface 36 is a sealing member, preferably in the form of an O-ring 38 adapted to sealingly engage the chamber wall 12 when the flange 30 is mounted thereon, preferably by means of bolts 40.

Figure 2A:
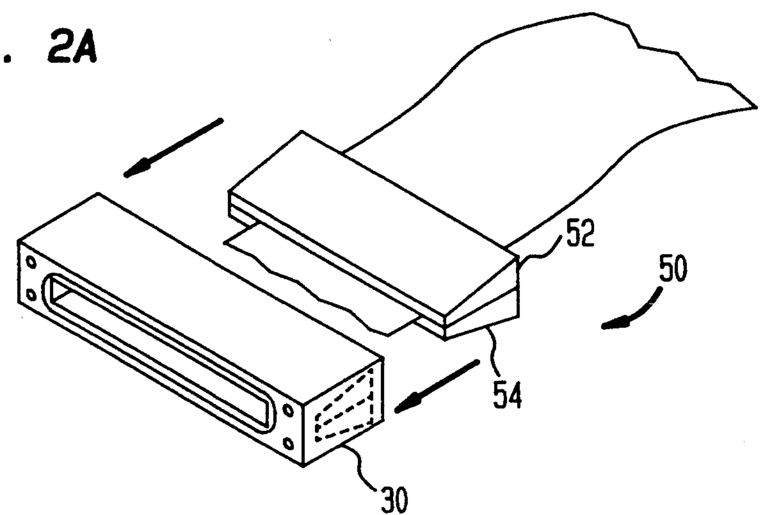
FIG. 2A shows an exploded pictorial view of the device of the present invention prior to final assembly.
Figure 2B:
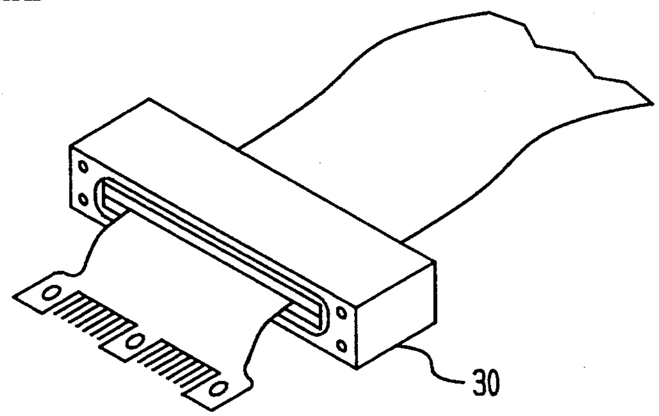
FIG. 2B shows a pictorial view of the device of the present invention fully assembled.

A preferred form of the present invention will now be described in connection with FIGS. 2A and 2B in pictorial form and in FIGS. 3, 4, 5, and 6. In this embodiment a wedge-shaped copper collar is integrally affixed to the copper shielding layer 16. The wedge-shaped collar 50 includes a pair of wedge-shaped members 52 and 54 which when mated and bonded together have a slot type opening 56 therein to allow for the passage of the cable 10 through the collar 50. A thin solder coating is placed on each of the members 52 and 54 and serves first to bond the member 52 to the member 54. This solder coating is also preferably 52 percent indium and 48 percent tin. The wedge-shaped copper collar 50 is adapted to mate with a wedge-shaped opening 58 in flange 30. After the collar 50 is inserted into the opening 58, the collar 50 is sealingly affixed to the flange 30 by the solder compound 34. Again, in this embodiment, the flange 30 includes an O-ring 38 on one surface thereof for sealing the flange 30 to the wall 12 of the sealed chamber.

In making the device of the present invention, the members 52 and 54 are first coated on all surfaces with a solder compound containing 52 percent indium and 48 percent tin. The members 52 and 54 are then placed on opposite sides of the cable 10 so that the cable 10 passes through slot 56. The collar 50 is then heated above the melting point of the solder compound, which in this case is 118 degrees centigrade, thereby causing the solder compound to reflow, in turn, bonding and sealing the copper collar members 52 and 54 to each other and to the cable 10.

After the collar 50 is mated with the opening 58 of flange 30, both the flange 30 and the collar 50 are heated to a temperature above the melting point of the solder compound, once again in this case 118 degrees centigrade, thereby causing the solder compound to reflow, in turn, bonding and sealing the copper collar 50 to the flange 30. The preferred solder compound of 52 percent indium and 48 percent tin has been selected for its characteristic of not outgassing in a very high vacuum environment, for example, at least $1\times10^{-7}$ Torr. In addition, its melting point of 118 degrees centigrade is low enough so as not to damage the laminating bond between the cable dielectric and the copper conductors in the cable.

Thus the present invention clearly teaches the provision of a device for passing a member, in particular a flat multi-conductor cable, through the wall of a sealed vacuum chamber in such a manner as to maintain the seal and avoid the outgassing problems inherent in prior solutions. In addition, the method of making this device is both simple and relatively inexpensive to manufacture.

While there have been described what are at present considered to be the preferred embodiments of the present invention, it will be obvious to those skilled in the art that various changes and modifications may be made therein, without departing from the invention, and it is, therefore, aimed in the appended claims to cover all such changes and modifications as follow in the true spirit and scope of the present invention.

What is claimed is:

1. A device for passing a flat multi-conductor electrical cable through the wall of a sealed chamber comprising:

said electrical cable having a first thin, flat, copper shielding layer on the top of said cable and a second thin, flat, copper shielding layer on the bottom of said cable and a copper wedge shaped member surrounding said electrical cable and integrally affixed to said first and second copper shielding layers;

a flange having an opening therein surrounding and spaced from said wedge shaped member; and a solder member completely filling the space between said flange opening and said wedge shaped member for creating a seal therebetween capable of maintaining a high pressure differential between opposite sides of said sealed chamber wall.

2. The device of claim 1 wherein said flange includes a surface adapted to engage said sealed chamber wall and further includes a sealing member mounted on said surface adapted to sealingly engage said sealed chamber wall.

3. The device of claim 2 wherein said flange further includes mounting means for drawing said sealing member into sealing engagement with said sealed chamber wall.

4. The device of claim 3 wherein said sealing member is an O-ring.

5. The device of claim 1 wherein said solder member includes a thin layer of solder coating said wedge shaped member.

6. The device of claim 5 wherein said solder member is a solder compound comprising at least 50% indium.

7. The device of claim 6, wherein said solder compound comprises 52% indium and 48% tin.

8. The device of claim 6 wherein said flange opening is wedge-shaped, surrounds said wedge-shaped member and is sealingly affixed thereto by said solder compound.

9. The device of claim 1 wherein said flange opening is wedge-shaped, surrounds said wedge-shaped member and is sealingly affixed thereto by said metal solder member.

* * * * *